United States Patent
Cohrs

(10) Patent No.: US 10,277,183 B2
(45) Date of Patent: Apr. 30, 2019

(54) VOLUME-DEPENDENT AUTOMATIC GAIN CONTROL

(71) Applicant: Sorenson IP Holdings, LLC, Salt Lake City, UT (US)

(72) Inventor: Paul W. Cohrs, Indianapolis, IN (US)

(73) Assignee: Sorenson IP Holdings, LLC, Salt Lake City, UT (US)

( * ) Notice: Subject to any disclaimer, the term of this patent is extended or adjusted under 35 U.S.C. 154(b) by 0 days.

(21) Appl. No.: 15/458,770

(22) Filed: Mar. 14, 2017

(65) Prior Publication Data

US 2018/0269842 A1    Sep. 20, 2018

(51) Int. Cl.
| | |
|---|---|
| *H03G 3/20* | (2006.01) |
| *H03G 3/30* | (2006.01) |
| *H03G 3/10* | (2006.01) |
| *H04R 3/00* | (2006.01) |

(52) U.S. Cl.
CPC ............ *H03G 3/3005* (2013.01); *H03G 3/10* (2013.01); *H04R 3/00* (2013.01); *H04R 2430/01* (2013.01)

(58) Field of Classification Search
CPC ........ H03G 3/32; H03G 3/301; H03G 3/3005; H03G 3/20; H03G 9/005; H03G 9/025; H04R 3/04; H04R 25/356
USPC ......... 381/107, 106, 321, 57, 102, 104, 109; 704/225
See application file for complete search history.

(56) References Cited

U.S. PATENT DOCUMENTS

| | | | |
|---|---|---|---|
| 5,165,017 A | 11/1992 | Eddington et al. | |
| 6,731,768 B1 | 5/2004 | Delage | |
| 2008/0015851 A1 | 1/2008 | Yamada | |
| 2008/0063220 A1* | 3/2008 | Lin | H03F 1/52 381/120 |
| 2008/0269926 A1* | 10/2008 | Xiang | H03G 3/32 700/94 |
| 2011/0275412 A1 | 11/2011 | Khawand | |
| 2012/0206195 A1* | 8/2012 | Helsloot | H03G 7/002 327/552 |
| 2014/0037108 A1* | 2/2014 | Christoph | H03G 3/20 381/107 |

(Continued)

FOREIGN PATENT DOCUMENTS

| | | |
|---|---|---|
| CN | 101800520 A | 8/2010 |
| JP | 2001320793 A | 11/2001 |

(Continued)

OTHER PUBLICATIONS

BIAMP Systems, "Automatic Gain Control", website: https://support.biamp.com/Tesira/Programming/Automatic_Gain_Control, retrieved on Nov. 10, 2016, 5 pages.

*Primary Examiner* — Norman Yu
(74) *Attorney, Agent, or Firm* — Maschoff Brennan

(57) ABSTRACT

A computer-implemented method to generate an audio output signal is disclosed. The method may include receiving an audio input signal at an automatic gain control (AGC) unit. The method may further include receiving a volume setting indicator signal at the AGC unit. Further, the method may include setting one or more operational parameters for the AGC unit based on the volume setting indicator signal. In addition, the method may include applying a gain to the audio input signal based on the one or more operational parameters to generate an audio output signal at a desired output level.

20 Claims, 6 Drawing Sheets

(56) References Cited

U.S. PATENT DOCUMENTS

| | | | |
|---|---|---|---|
| 2014/0086434 A1* | 3/2014 | Bang | A61B 5/123 |
| | | | 381/98 |
| 2014/0221729 A1 | 8/2014 | Basinger | |
| 2017/0048615 A1* | 2/2017 | Son | H03G 3/3005 |

FOREIGN PATENT DOCUMENTS

| | | |
|---|---|---|
| JP | 2011151634 A | 8/2011 |
| KR | 20060026557 A | 3/2006 |
| KR | 100710065 B1 | 4/2007 |
| WO | 2014035845 A2 | 3/2014 |

* cited by examiner

VOLUME-DEPENDENT AUTOMATIC GAIN CONTROL

FIELD

The embodiments discussed herein are related to automatic gain control.

BACKGROUND

Electronic devices, such as electronic communication devices, may be configured to provide, via automatic gain control (AGC), an output signal having a controlled signal amplitude, despite variations in the amplitude of a received input signal.

The subject matter claimed herein is not limited to embodiments that solve any disadvantages or that operate only in environments such as those described above. Rather, this background is only provided to illustrate one example technology area where some embodiments described herein may be practiced.

SUMMARY

A computer-implemented method to generate an audio output signal is disclosed. The method may include receiving, at an automatic gain control unit, an audio input signal and a volume setting indicator signal. The volume setting indicator signal may be indicative of a volume setting, which may comprise a user-defined volume setting. The method may further include setting one or more operational parameters for the automatic gain control unit based on the volume setting indicator signal. In addition, the method may also include applying a gain to the audio input signal based on the one or more operational parameters to generate an audio output signal at a desired output level.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
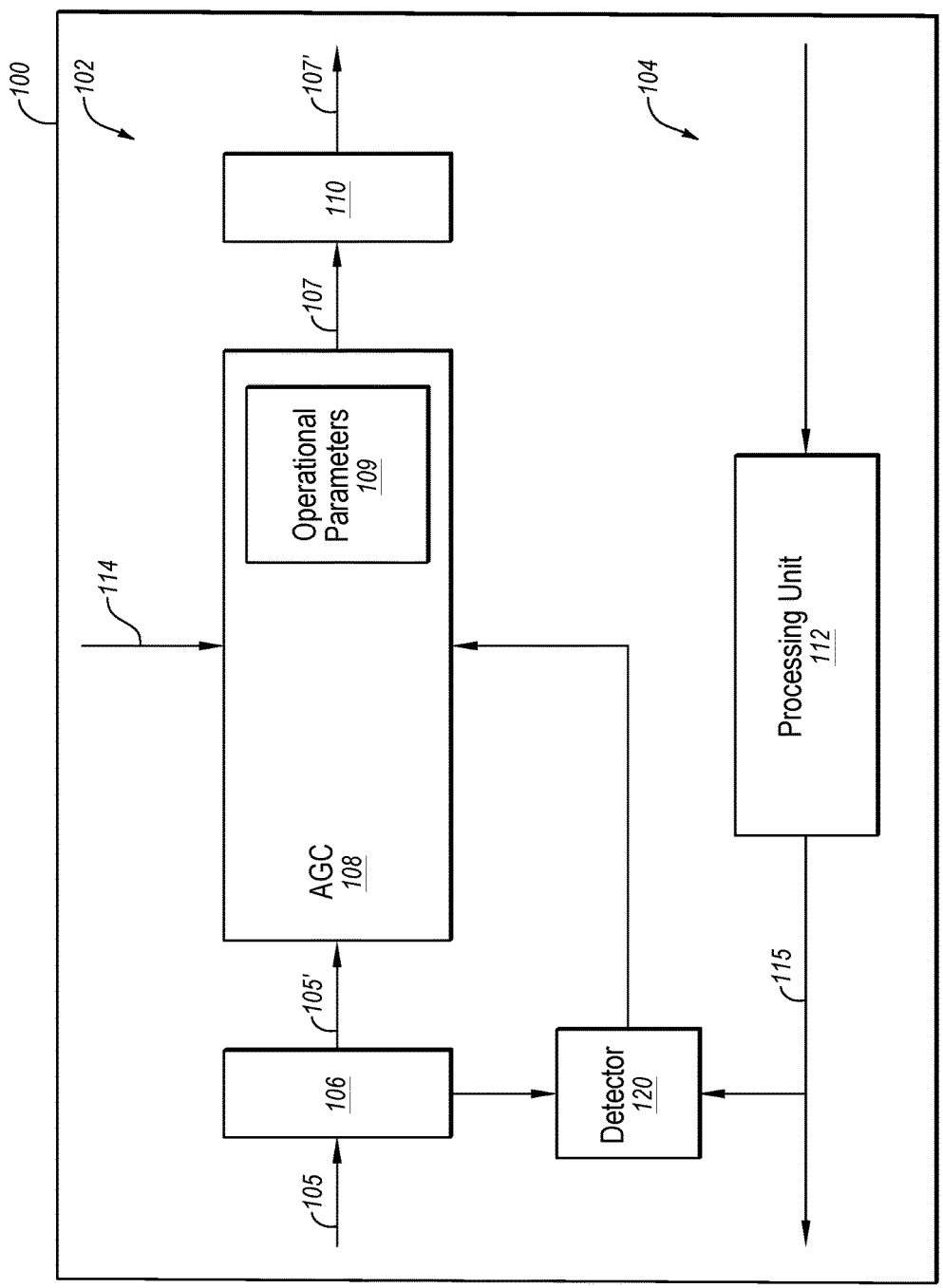
FIG. 1 illustrates an example audio transceiver including an automatic gain control unit.

Some embodiments of the present disclosure relate to volume-dependent automatic gain control. For example, in various embodiments, behavior of an automatic gain control unit may depend on a volume setting (e.g., a user-defined volume setting) of a device. In contrast, some known automatic gain control systems adjust a gain of an audio signal independent of a volume setting. For example, some known automatic gain control systems adjust an amplitude or power of an audio input signal by adjusting a gain, such as a voltage gain, applied to the audio input signal. The known automatic gain control systems may provide the adjusted audio input signal for amplification based on the volume setting. In these known automatic gain control systems, the amplitude or power of the audio input signal may be adjusted such that adjust audio input signal provided for amplification based on the volume setting have approximately the same or the same amplitude or power.

As indicated, in some embodiments of the present disclosure, an automatic gain control unit may depend on a volume setting. In these and other embodiments, an automatic gain control unit may receive an audio input signal and a signal that is indicative of the volume setting of a user device. In these and other embodiments, one or more operational parameters of the automatic gain control unit may be configured (e.g., set and/or modified) based on the volume setting.

In some embodiments, an operational parameter that defines a maximum amount of gain ("maximum gain parameter") that may applied to an audio signal at any one time (e.g., during an audio sample (e.g., every 0.125 milliseconds)) by the automatic gain control unit may be set and/or modified based on the volume setting. Further, in some embodiments, an operational parameter that defines a maximum amplification level ("maximum amplification parameter") for the audio signal as applied by automatic gain control unit may be set and/or modified based on the volume setting. The maximum amplification level may also be referred to as a "maximum output signal level" or a "target signal level."

In addition, the automatic gain control unit may apply a gain to an audio input signal (e.g., to amplify the audio input signal) based on the one or more operational parameters to generate an audio output signal at a particular output level. For example, the automatic gain control unit may use the maximum gain parameter to determine a gain, such as a voltage or current gain, to apply to the audio input signal to increase an amplitude or power of the audio input signal. Alternatively or additionally, the automatic gain control unit may use the maximum amplification parameter to determine the gain to apply to the audio input signal.

In some embodiments, an aggressiveness of an automatic gain control unit may vary based on the volume setting. For example, an automatic gain control unit may provide a more aggressive approach at higher volume settings and/or as the volume setting is increased, and a less aggressive approach at lower volume settings and/or as the volume setting is decreased. For example, at higher volume settings, the automatic gain control unit may provide a greater amount of gain and/or adjust the gain relatively quickly. At lower volume settings, the automatic gain control unit may provide a lesser amount of gain and/or adjust the gain relatively slowly. Stated another way, the effect of the automatic gain control unit on an amplitude, magnitude, or power of the audio input signal may be greater at higher volume settings compared to lower volume settings. For example, if a volume controller (e.g., on a user interface) has settings between one (1) and ten (10), wherein one (1) is the lowest volume setting and ten (10) is the highest volume setting, the effect of the automatic gain control unit may be greater at a volume setting of, for example, seven (7) compared to a volume setting of, for example three (3). Applying a less aggressive approach at lower volume settings may result in a more natural sounding audio output.

In some embodiments, at least one of the one or more operational parameters of an automatic gain control unit may be maximized when the volume level is at an upper limit. As the volume level is decreased (e.g., via a user), at least one of the one or more operational parameters may be modified to decrease the aggressiveness of the automatic gain control unit and reduce the gain variation. Adjusting the operational parameters based on volume level settings may result in a more natural sounding signal at lower volume settings and/or as the volume setting is being reduced, while providing a high level of gain at higher volume settings and/or as the volume setting is being increased.

Some known automatic gain control systems may use operational parameters that are independent of the volume setting. As a result, some known automatic gain control systems, which may aggressively boost or attenuate audio signals independent of a volume setting, may result in the generation of unnatural sounding audio (e.g., bursts or pulsing of the audio signal during transitions between low (e.g., quiet), normal, and high (e.g., loud) input signals). In contrast, various embodiments provided in this disclosure may generate an audio output signal at a desired output level based on a volume setting (e.g., a user-defined volume setting).

Embodiments of the present disclosure are now explained with reference to the accompanying drawings.

FIG. 1 depicts an example audio transceiver 100 including a receive path 102 and a transmit path 104. Receive path 102 includes a first processing unit 106, an automatic gain control (AGC) unit 108 coupled to first processing unit 106, and a second processing unit 110 coupled to AGC unit 108. An audio input signal 105 may be received at first processing unit 106, and first processing unit 106 may process audio input signal 105 to generate an audio input signal 105', which may comprise, for example, a digital audio signal.

AGC unit 108 may receive and amplify audio input signal 105' to generate an audio output signal 107, which may also include a digital audio signal. Audio output signal 107 may be received by second processing unit 110. Second processing unit 110 may process output signal 107 to generate an audio output signal 107', which may be conveyed to an output device (e.g., output device 208 of FIG. 3), such as a speaker. Transmit path 104 includes a third processing unit 112 and may be configured for transmitting an audio signal 115 to an audio interface, such as a telephone line interface, a Bluetooth interface, a VOIP interface, or any other suitable audio interface.

In some embodiments, first processing unit 106 may be configured to receive and process an audio input signal 105, which may be conveyed from an audio input source, such as a telephone line, a Bluetooth device, a VOIP device, etc. First processing unit 106, which may include, for example, a digital signal processor (DSP), may be configured to perform one or more operations on audio input signal 105. For example, first processing unit 106 may provide filtering, echo cancellation, noise reduction, and/or other processing operations on audio input signal 105 to generate audio input signal 105'.

Audio transceiver 100 may also include a detector 120, which may be configured to detect double talk (e.g., far-end and near-end signals). Further, in some embodiments, audio transceiver 100 may be configured to prevent a gain increase, as described more fully below, if double talk is detected (e.g., via detector 120).

AGC unit 108, which, in various embodiments, may include, for example, one or more software modules, one or more processing units (e.g., DSPs), or any combination thereof, may be configured to receive an audio input signal 105' and generate audio output signal 107 at a desired signal level. Alternatively or additionally, AGC unit 108 may include one or more hardware components (e.g., filters, amplifiers, etc.), which may be controlled by software and/or one or more processing units.

According to various embodiments, AGC unit 108 may include operational parameters 109, which may be set and/or modified by, for example, AGC unit 108. Although operational parameters 109 are depicted as being within AGC unit 108, the present disclosure is not so limited. Rather, in some embodiments, values for operational parameters 109 may be stored external to and accessible by AGC unit 108.

Figure 2:
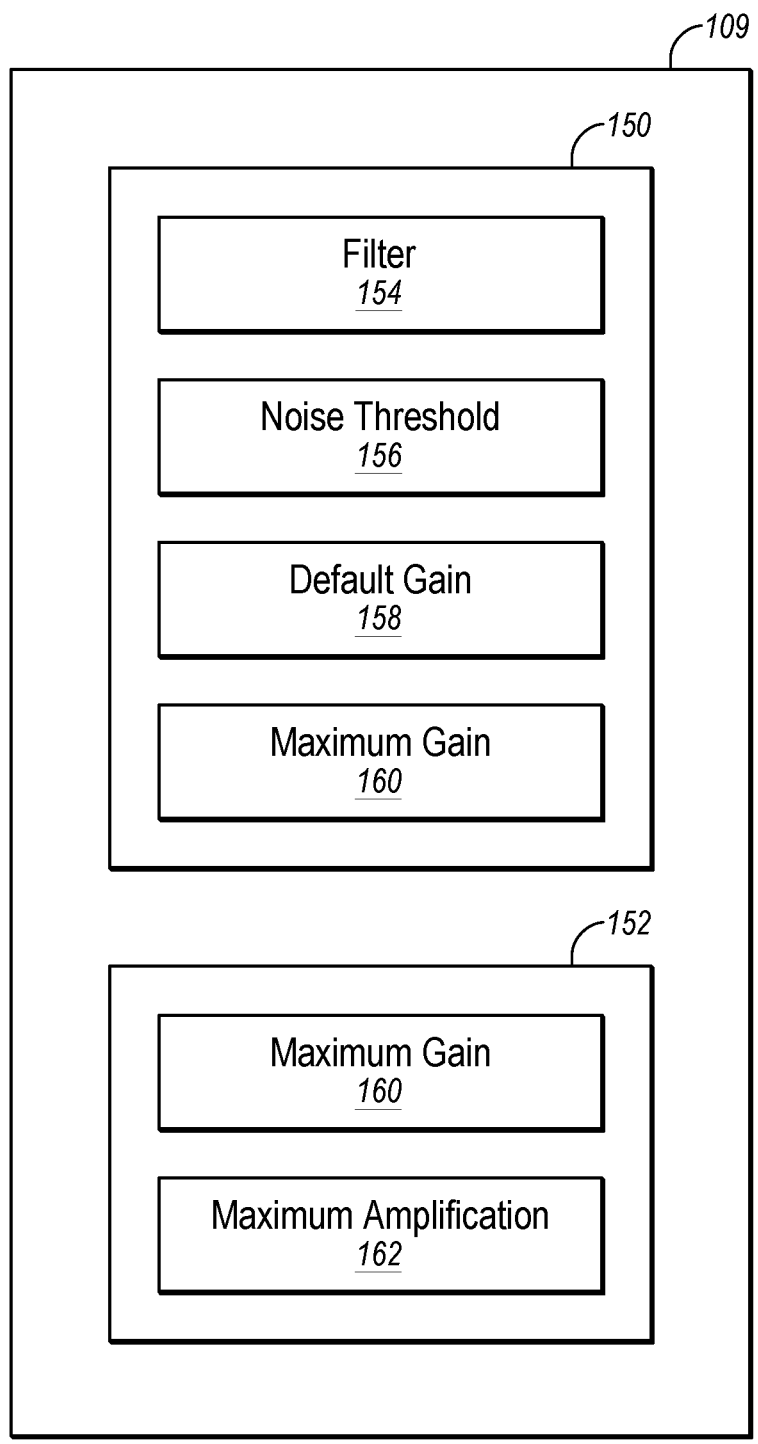
FIG. 2 depicts example operational parameters for an automatic gain control unit.

FIG. 2 depicts example operational parameters 109. In one embodiment, operational parameters 109 may include source-dependent operational parameters 150 and volume-dependent operational parameters 152. As described more fully below, source-dependent operational parameters 150 may include one or more of: filter parameters 154 (e.g., a speed and/or an aggressiveness of one or more filters of AGC unit 108), a noise threshold parameter 156 (e.g., indicating a noise threshold value for AGC unit 108), and/or a default gain parameter 156 (e.g., indicating a default gain of AGC unit 108). In some embodiments, source-dependent operational parameters 150 may also include a maximum gain parameter 160.

Volume-dependent operational parameters 152 may include maximum gain parameter 160 (e.g., indicating a maximum amount of gain that may applied to an audio signal at any one time) and/or a maximum amplification parameter 162 (e.g., indicating the total maximum amplification level that may be applied to an audio signal).

With reference to FIG. 1, according to various embodiments, AGC unit 108 may be configured to set one or more of operational parameters 109 based on a source of audio input signal 105. A source of audio input signal 105, which may be selected be a user, may include for example, a telephone line, a Bluetooth connection, a VOIP connection, or any other suitable audio source. One or more of the operational parameters (e.g., parameters 150 of FIG. 2) of AGC unit 108 that may depend on the source of audio input signal 105 may include, for example, filter parameters 154 (e.g., indicating a speed and/or an aggressiveness of one or more filters of AGC unit 108 (e.g., how fast the one or more filters increase or decrease a gain)), noise threshold parameter 156 (e.g., indicating a noise threshold value for AGC unit 108), and default gain parameter 156 (e.g., indicating a default gain of AGC unit 108). Further, in some embodiments, an operational parameter for indicating a maximum amount of gain (e.g., maximum gain parameter 160 of FIG. 2) that may applied to audio input signal 105 at any one time may depend on the source of audio input signal 105.

Further, according to various embodiments, one or more of operational parameters 109 of AGC unit 108 may depend on a volume setting. In some embodiments, AGC 108 may be configured to receive a signal 114 from, for example, a user interface (see e.g., user interface 216 of FIG. 3) that may be indicative of a user-defined volume setting. Signal 114 may also be referred to herein as a "volume setting indicator signal." Further, AGC unit 108 may be configured to set and/or modify one or more operational parameters (e.g., parameters 152 of FIG. 2) based on the volume setting indicator signal. For example, maximum gain parameter 160 (e.g., the operational parameter for indicating a maximum amount of amount of gain that may applied to an audio signal at any one time) and/or maximum amplification parameter 162 (e.g., the operational parameter for indicating the total maximum amplification that may be applied to an audio signal) may be set and/or modified based on the volume setting indicator signal.

As noted above, maximum gain parameter 160 and/or maximum amplification parameter 162 may depend on a volume setting (e.g., a user-defined volume setting), and an aggressiveness of AGC unit 108 may depend on maximum gain parameter 160 and/or the maximum amplification parameter 162. For example, maximum gain parameter 160 may determine how much gain may be applied to the audio signal at any one time, and maximum amplification parameter 162 may determine the total maximum amplification that may be applied to an audio signal. More specifically, for example, if a user-defined volume is set to a relatively low level (e.g., a level 2 on a scale of 1 to 10), maximum gain parameter 160 may be set to 5 dB and maximum amplification parameter 162 may be set to 35 dB. As another example, if the user-defined volume is set to a relatively high level (e.g., a level 8 on a scale of 1 to 10), maximum gain parameter 160 may be set to 12 dB and maximum amplification parameter 162 may be set to 60 dB.

Maximum gain parameter 160 and/or maximum amplification parameter 162 may be modified in a linear or non-linear manner. In at least one embodiment, maximum gain parameter 160 and/or maximum amplification parameter 162 may be maximized when the volume setting is maximized, and maximum gain parameter 160 and/or maximum amplification parameter 162 may change (e.g., decrease) as the volume setting is decreased. Initial values of maximum gain parameter 160 and/or maximum amplification parameter 162 and/or reduction factors used to adjust the maximum gain parameter 160 and/or maximum amplification parameter 162 may depend on a selected output device (e.g., handset, speakerphone, Bluetooth device, etc.). Further, maximum gain parameter 160 and/or maximum amplification parameter 162 may be modified based on a difference between the current receive volume setting and a maximum volume setting.

In some embodiments, AGC unit 108 may also be configured to determine an energy level of audio input signal 105'. For example, AGC unit 108 may be configured to determine the energy level of audio input signal 105' via a root-mean-square (RMS) measurement, which may include determining an average energy level of a plurality of samples of audio input signal 105'. In some embodiments, AGC unit 108 may be configured to measure a signal-to-noise ratio (SNR) of audio input signal 105'. The SNR of audio input signal 105' may be measured via any suitable operation. For example, the SNR of audio input signal 105' may be determined based on the RMS measurement.

In some embodiments, AGC unit 108 may be configured to compare a noise threshold value, which may be defined by noise threshold parameter 156, to the measured SNR of audio input signal 105'. In response to the SNR of audio input signal 105' being less than the noise threshold value, the gain applied to audio input signal 105 by the AGC unit 108 may be decreased (e.g., by 1 dB, 2 dB, 5 dB, or any other amount). In response to the SNR of audio input signal 105' being greater than or equal to the noise threshold value, a target gain for AGC unit 108 may be determined. In some embodiments, the target gain, which may also be referred to as a "desired gain" or a "particular gain," may be calculated based on maximum amplification parameter 162, which, as described above, identifies a maximum amplification level for audio input signal 105'. Alternatively or additionally, the target gain may be calculated based on audio input signal 105' and/or a target output signal. Further, the target output signal may be based on the use case (e.g., selected input and/or output devices) and may be adjusted based on the volume setting.

In addition, AGC unit 108 may be configured to apply a gain to audio input signal 105' to reach the target gain for audio input signal 105' and generate audio output signal 107. According to various embodiments, the gain may be applied to audio input signal 105' based on maximum gain parameter 160 and/or maximum amplification parameter 162. In one example, the gain may be applied so as to not apply a gain at any one time greater than the amount defined by maximum gain parameter 160 (e.g., to prevent undesirable audio "spikes" and/or "pops") and/or to not amplify audio input signal 105' more than an amount as defined by maximum amplification parameter 162 (e.g., see FIG. 2). Further, according to at least one embodiment, the gain may be filtered (e.g., via a low-pass filter) so as to not apply a gain at any one time greater than the amount defined by maximum gain parameter 160. In some embodiments, the gain may be filtered (e.g., via a low-pass filter) based on the attack and decay times, which may be set for a particular application. Filtering the gain may limit the speed of the change in gain and may provide a smooth transition as the gain changes.

Second processing unit 110, which may include a DSP for example, may be configured to receive audio output signal 107 from AGC unit 108 and perform one or more operations on audio output signal 107 to generate an audio output signal 107'. For example, second processing unit 110 may provide filtering (e.g. equalizer (EQ) filtering), acoustic cancellation (e.g., acoustic echo cancellation), and/or any other digital signal processing operations on audio output signal 107 to generate audio output signal 107' at a desired output level.

Figure 3:
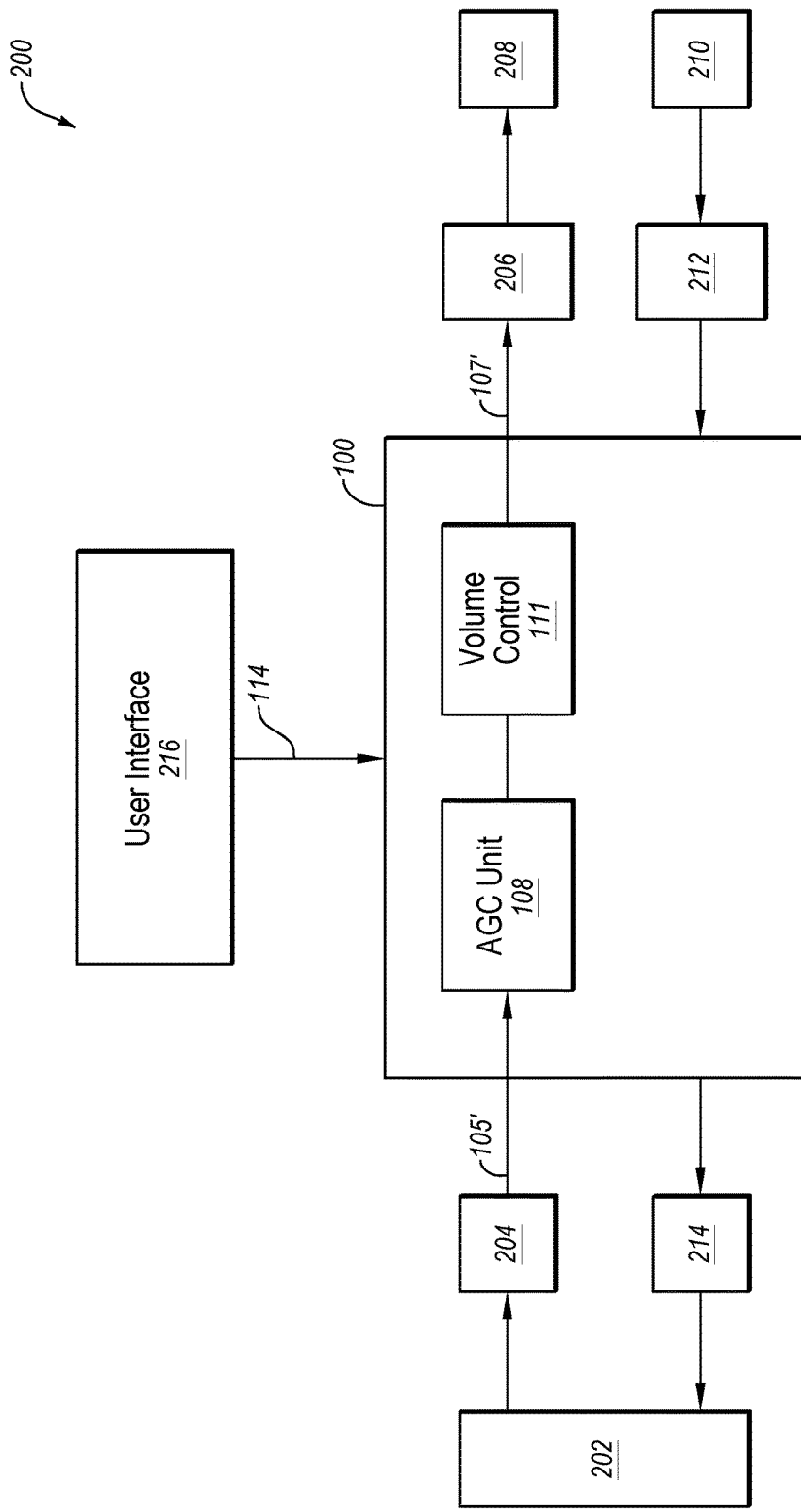
FIG. 3 illustrates an example device including an audio transceiver.

FIG. 3 depicts an example device 200, according to at least one embodiment of the present disclosure. Device 200 may include any suitable audio device, such as a Bluetooth device, a computer (e.g., a laptop computer, a tablet computer, etc.), a smartphone, a mobile phone, a phone console, a headset, a public switched telephone network (PSTN) phone, or any other communication device.

Device 200 includes audio transceiver 100, as described above with reference to FIG. 1. Device 200 further includes an audio interface 202, which may include, for example a telephone line interface (e.g., a Data Access Arrangement (DAA)), a Bluetooth interface, a VOIP interface, a public switched telephone network (PSTN) interface, or any other audio interface. Further, device 200 includes an analog-to-digital converter (ADC) 204, an audio codec 206, and an output device 208. Device 200 also includes an input device 210, an audio codec 212, and a digital-to-analog converter (DAC) 214. As examples, audio codec 206 may include DAC codec 214 and audio codec 212 may include an ADC codec. Moreover, for example, output device 208 may include a speaker, and input device 210 may include a microphone (e.g., in a handset, Bluetooth device, neckloop, etc.). In some embodiments, output device 208 and/or input device 210 may be selected by a user.

Transceiver 100 may include AGC unit 108 coupled between ADC 204 and audio codec 206. As noted above with reference to FIG. 1, AGC unit 108 may receive input audio signal 105' and amplify input audio signal 105' based on one or more operational parameters to generate audio output signal 107'. In addition, transceiver 100 may also include a volume control unit 111 configured for adjusting a volume of an audio signal conveyed from AGC unit 108 based on a volume setting. For example, volume control unit 111 may include one or more amplifiers. In some embodiments, volume control unit 111 may be part of AGC unit 108 and a volume of the audio samples may be controlled substantially simultaneously with the automatic gain control. In other embodiments, a volume of the audio samples may be controlled after the automatic gain control (e.g., as a digital signal prior to audio codec 206 or as an analog signal after audio codec 206).

A contemplated operation of AGC unit 108 will now be described. In response to audio input signal 105' being received at AGC unit 108, one or more operational parameters (e.g., operational parameters 150; see FIG. 2) of AGC unit 108 may be set based on audio input signal 105' and more specifically, a source of audio input signal 105'. For example, one or more filter parameters 154 (e.g., an aggressiveness of one or more filters of AGC unit 108), noise threshold parameter 156 (e.g., a noise threshold value for AGC unit 108), and/or default gain parameter 158 (e.g., a default gain value of AGC unit 108) may be set based on the source of audio input signal 105'. Further, maximum gain parameter 160 may be set to a default value based on the source of audio signal 105'.

In addition, AGC 108 may receive signal 114 from user interface 216, wherein, as noted above, signal 114 is indicative of a volume setting (e.g., a user-defined volume setting). In this specific example, signal 114 indicates that the user-defined volume is at a setting of two (2) (e.g., on a scale of 1 to 10, with 1 being the lowest (quietest) setting and 10 being the highest (loudest) setting). In response to receipt of signal 114, AGC unit 108 may set and/or modify one or more operational parameters of AGC unit 108. For example, maximum gain parameter 160 may be set or modified to 3 dB and/or maximum amplification parameter 162 may be set to 20 dB.

Continuing with this example, an energy level and an SNR of audio input signal 105' may be determined (e.g., for each input sample). Further, if the SNR of audio input signal 105' is greater than or equal to the noise threshold value (e.g., as defined by noise threshold parameter 156), a target gain for AGC unit 108 may be determined. In this example, the target gain may be determined to be 28 dB, which is greater than the amplification limit defined maximum amplification parameter 162. Thus, in this example, the target gain is adjusted to 20 dB, which is the amplification limit as defined by maximum amplification parameter 162.

In addition, a gain may be applied to audio input signal 105' to reach the target gain of 20 dB. In this example, because maximum gain parameter 160 is set to 3 dB, only 3 dB worth of gain may be applied to audio input signal 105' at any one time.

Continuing with this example, AGC 108 may receive an updated signal 114, which indicates that the user-defined volume has been changed to a setting of eight (8). In response to receipt of signal 114, AGC unit 108 may modify one or more operational parameters of AGC unit 108. For example, maximum gain parameter 160 may be modified to 6 dB and/or maximum amplification parameter 162 may be modified to 60 dB.

Further, the target gain, which in this example is 28 dB, is less than the value of maximum amplification parameter 162. Thus, in this example, the target gain is not limited by maximum amplification parameter 162. In addition, a gain may be applied to audio input signal 105' to reach the target gain of 28 dB. In this example, because maximum gain parameter 160 is set to 6 dB, 6 dB worth of gain may be applied to audio input signal 105' at any one time. In some embodiments, maximum amplification parameter 162 may change in response to a change in the volume setting. The target gain may vary (e.g., every sample) based on audio input signal 105', maximum amplification parameter 162, and/or maximum gain parameter 160.

Figure 4:
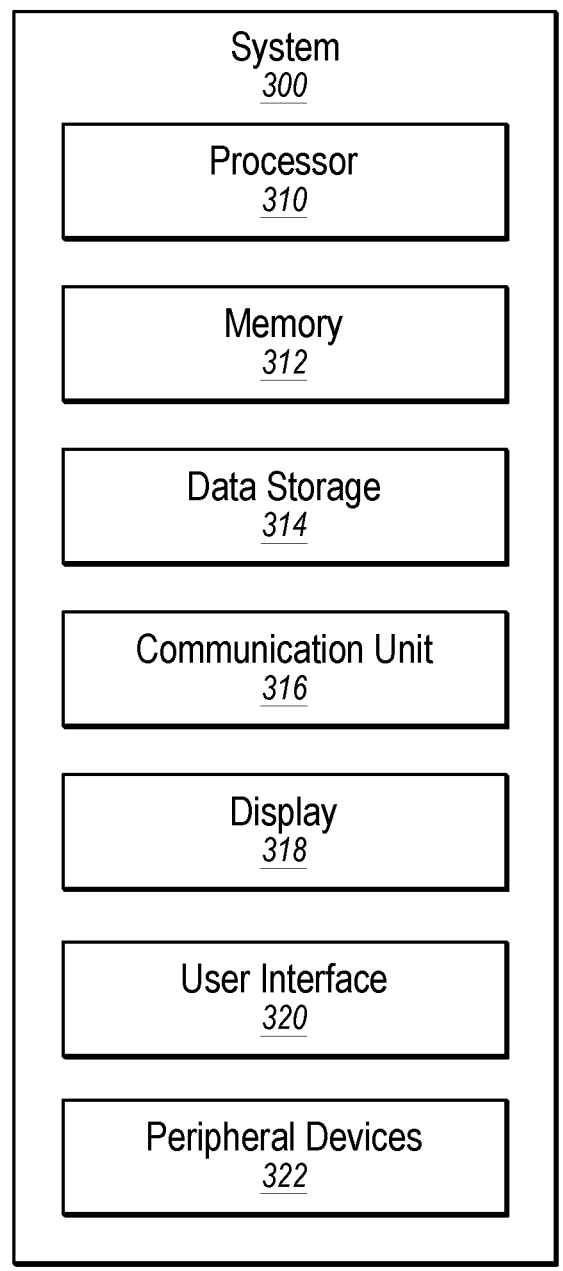
FIG. 4 illustrates an example system that may be used in generating an audio output signal.

FIG. 4 illustrates an example computing system 300 that may be arranged in accordance with at least one embodiment described in the present disclosure. System 300 may include a processor 310, a memory 312, a data storage 314, a communication unit 316, a display 318, a user interface 320, and peripheral devices 322, which all may be communicatively coupled. In some embodiments, system 300 may be part of, or may include, any of the devices described in this disclosure. For example, system 300 may be part of, or may include audio transceiver 100 of FIG. 1 and/or device 200 of FIG. 3.

Generally, processor 310 may include any suitable special-purpose or general-purpose computer, computing entity, or processing device including various computer hardware or software modules and may be configured to execute instructions stored on any applicable computer-readable storage media. For example, processor 310 may include a microprocessor, a microcontroller, a digital signal processor (DSP), an application-specific integrated circuit (ASIC), a Field-Programmable Gate Array (FPGA), or any other digital or analog circuitry configured to interpret and/or to execute program instructions and/or to process data, or any combination thereof.

Although illustrated as a single processor in FIG. 4, it is understood that processor 310 may include any number of processors distributed across any number of networks or physical locations that are configured to perform individually or collectively any number of operations described herein. In some embodiments, processor 310 may interpret and/or execute program instructions and/or process data stored in memory 312, data storage 314, or memory 312 and data storage 314. In some embodiments, processor 310 may fetch program instructions from data storage 314 and load the program instructions into memory 312.

After the program instructions are loaded into memory 312, processor 310 may execute the program instructions. For example, system 300 may include, or may be part of, AGC unit 108 of FIG. 1. In these and other embodiments, the program instructions may cause processor 310 to perform the operations of setting and/or modifying one or more operational parameters of an AGC unit based on a volume setting and/or generating an audio output signal at a desired output level based on the volume setting.

Memory 312 and data storage 314 may include computer-readable storage media for carrying or having computer-executable instructions or data structures stored thereon. Such computer-readable storage media may be any available media that may be accessed by a general-purpose or special-purpose computer, such as processor 310. By way of example, and not limitation, such computer-readable storage media may include non-transitory computer-readable storage media including Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage media which may be used to carry or store desired program code in the form of computer-executable instructions or data structures and which may be accessed by a general-purpose or special-purpose computer. Combinations of the above may also be included within the scope of computer-readable storage media. Computer-executable instructions may include, for example, instructions and data configured to cause processor 310 to perform a certain operation or group of operations.

Communication unit 316 may include any component, device, system, or combination thereof that is configured to transmit or receive information over a network. In some embodiments, communication unit 316 may communicate with other devices at other locations, the same location, or even other components within the same system. For example, communication unit 316 may include a modem, a network card (wireless or wired), an infrared communication device, a wireless communication device (such as an antenna), and/or chipset (such as a Bluetooth device, an 802.6 device (e.g., Metropolitan Area Network (MAN)), a WiFi device, a WiMax device, cellular communication facilities, etc.), plain old telephone service (POTS), and/or the like. Communication unit 316 may permit data to be exchanged with a network and/or any other devices or systems described in the present disclosure.

Display 318 may be configured as one or more displays, like an LCD, LED, or other type display. Display 318 may be configured to present video, text captions, user interfaces, and other data as directed by processor 310. For example, display 318 may present a media file, a transcript, a multimedia message, among other information.

User interface 320 may include any device that allows a user to interface with system 300. For example, user interface 320 may include a mouse, a track pad, a keyboard, a touchscreen, a telephone switch hook, and/or a telephone keypad, a volume control, among other devices. User interface 320 may receive input from a user and provide the input to processor 310. For example, the user interface 320 may receive an indication of the volume setting from a user.

Peripheral devices 322 may include one or more devices. For example, the peripheral devices may include a microphone, an imager, and/or a speaker, among other peripheral devices. In these and other embodiments, the microphone may be configured to capture audio. The imager may be configured to capture digital images. The digital images may be captured in a manner to produce video or image data. In some embodiments, the speaker may broadcast audio received by system 300 or otherwise generated by the system 300.

Modifications, additions, or omissions may be made to the system 300 without departing from the scope of the present disclosure.

Figure 5:
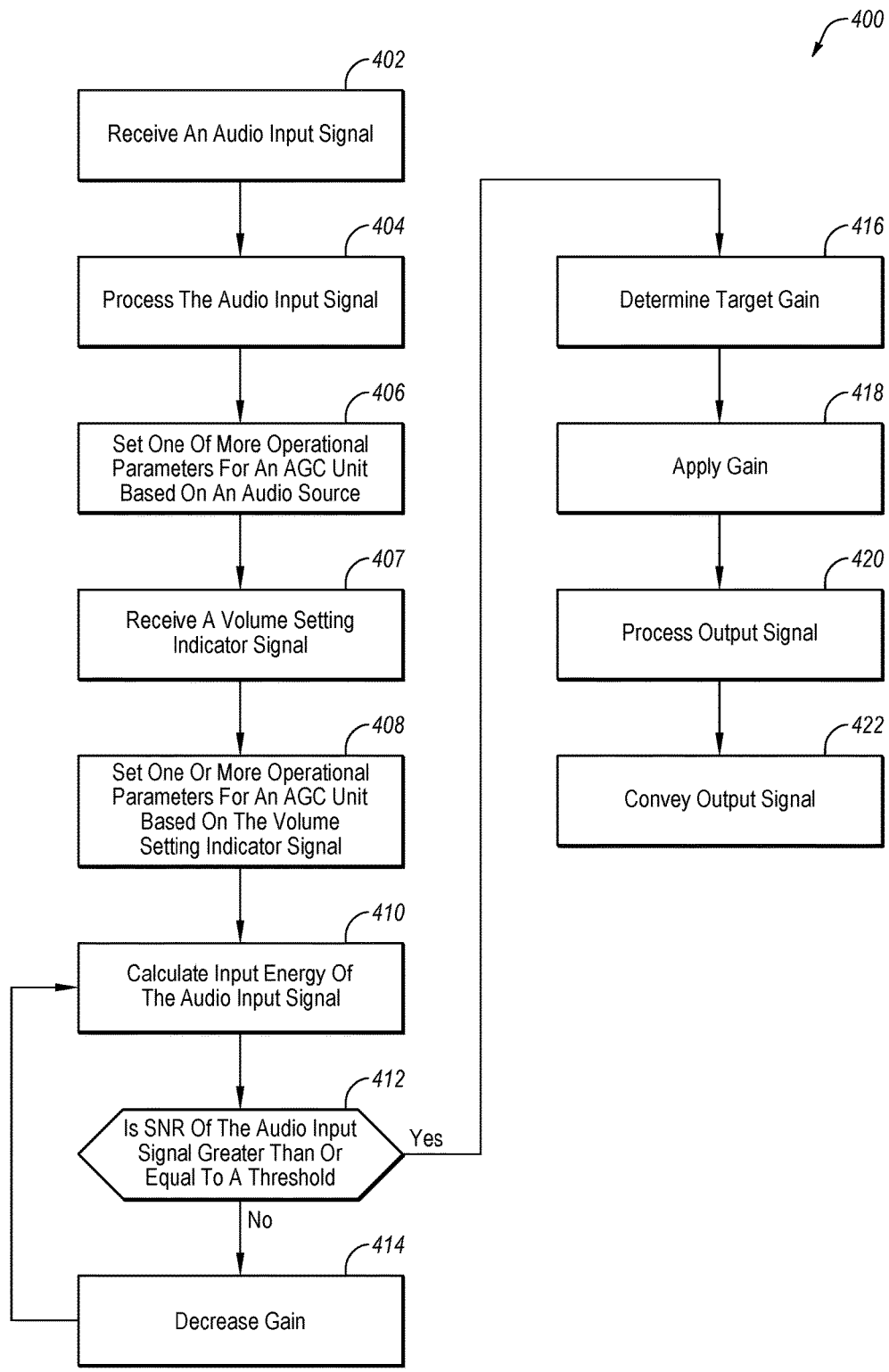
FIG. 5 is a flowchart of an example computer-implemented method to generate an audio output signal.

FIG. 5 is a flowchart of an example computer-implemented method to generate an audio output signal at a desired output level. Method 400 may be arranged in accordance with at least one embodiment described in the present disclosure. Method 400 may be performed, in whole or in part, in some embodiments by a system and/or device, such as transceiver 100, device 200, system 300, and/or a communication system 500 of FIGS. 1, 3, 4, and 6, respectively. In these and other embodiments, method 400 may be performed based on the execution of instructions stored on one or more non-transitory computer-readable media. Although illustrated as discrete blocks, various blocks may be divided into additional blocks, combined into fewer blocks, or eliminated, depending on the desired implementation.

Method 400 may begin at block 402. At block 402, an audio input signal may be received, and method 400 may proceed to block 404. For example, the audio input signal (e.g., audio input signal 105), which may be conveyed via an audio source (e.g., a telephone line, a Bluetooth device, a VOIP device, etc.), may be received at an audio transceiver (e.g., audio transceiver 100 of FIG. 1). The audio input signal may include an analog signal or a digital signal At block 404, the audio input signal may be processed, and method 400 may proceed to block 406. For example, a processor (e.g., first processor unit 106 of FIG. 1) may filter audio input signal 105, reduce, and possibly cancel, echoes in audio input signal 105, and/or reduce noise in audio input signal 105 to generate audio input signal 105'. Further, if the audio input signal received at block 402 includes an analog signal, the audio input signal may be converted to a digital signal. Further, the processor may convey the audio input signal to an AGC unit (e.g., AGC unit 108 of FIG. 1).

At block 406, one or more operational parameters may be set based on a source of the audio input signal, and method 400 may proceed to block 408. For example, an AGC unit (e.g., AGC unit 108) may set the one or more of operational parameters (e.g. operational parameters 150; see FIG. 2) of AGC unit 108 (see FIG. 1) based on the source of audio input signal 105'. More specifically, for example, with reference to FIG. 2, one or more filter parameters 154 (e.g., an speed and/or aggressiveness of one or more filters of AGC unit 108), noise threshold parameter 156 (e.g., a noise threshold value for AGC unit 108), and/or default gain parameter 158 (e.g., a default gain of AGC unit 108) may be set based on the source of the audio input signal.

At block 407, a volume setting indicator signal, which is indicative of a volume setting, may be received. For example, signal 114 (see FIGS. 1 and 3) may be received at an AGC unit (e.g., AGC unit 108 of FIG. 1). In one example, the volume setting indicator signal may be indicative of a user-defined volume setting. Further, for example, the volume setting indicator signal may be received from a user interface, such as user interface 216 of FIG. 3.

At block 408, one or more operational parameters may be set and/or modified based on the volume setting, and method 400 may proceed to block 410. In one embodiment, the one or more operational parameters (e.g. operational parameters 152; see FIG. 2) of an AGC unit (e.g., AGC unit 108 of FIG. 1) may be set and/or modified based on the volume setting. For example, the volume setting may include a user-defined volume setting set by a user via a user interface (e.g., user interface 216 of FIG. 3) of a user device. Further, the one or more operational parameters may include, for example, maximum gain parameter 160 and/or maximum amplification parameter 162 (see FIG. 2).

At block 410, a SNR of the received audio input signal may be determined, and method 400 may proceed to block 412. The SNR of received audio input signal 105' may be determined via, for example, AGC unit 108 (see FIG. 1) or another processor, such as the first processor unit 106 of FIG. 1. For example, in one embodiment, an RMS measurement of audio input signal 105' may be determined via determining an average energy level of a plurality of samples of received audio input signal 105'. Further, the SNR of audio input signal 105' may be determined based on the RMS measurement.

At block 412, a noise threshold value may be compared to the determined SNR of the audio input signal. For example, AGC unit 108 (see FIG. 1) may compare the noise threshold value to the determined SNR of audio input signal 105'. For example, the noise threshold value may be defined by noise threshold parameter 156 (see FIG. 2) of AGC unit 108. If the SNR of the audio input signal is less than the noise threshold value, method 400 may proceed to block to block 414. If the SNR of the audio input signal is greater than or equal to the noise threshold value, method 400 may proceed to block 416.

At block 414, a gain applied to the audio input signal may be decreased, and method 400 may revert back to block 410. In at least one example, AGC 108 (see FIG. 1) may decrease the gain applied audio input signal 105'. For example, the gain may be decreased by 1 dB, 2 dB, 5 dB, or any other amount.

At block 416, a target gain for the audio input signal may be determined, and method 400 may proceed to block 418. For example, the target gain may be determined by the AGC unit (e.g., AGC unit 108 of FIG. 1) based on maximum amplification parameter 162, which, as described above, identifies a maximum amplification level for the audio input signal. In some embodiments, the target gain may be based on a level (e.g., the RMS level) of audio input signal 105' and/or maximum amplification parameter 162. Further, the target gain may be limited by maximum gain parameter 160. In addition, the target gain may be filtered to smooth out a gain transition.

At block 418, a gain may be applied to the audio input signal to generate an audio output signal at a desired output level, and method 400 may proceed to block 420. For example, the gain may be applied (e.g., via AGC unit 108) to audio input signal 105' based on maximum gain parameter 160 and/or the maximum amplification parameter 162 (see FIG. 2). In one example, the gain may be applied so as to not apply a gain at any one time greater than the maximum gain, as defined by maximum gain parameter 160 (e.g., to prevent audio spikes and/or pops). For example, if maximum gain parameter 160 is set to 5 dB, no more than 5 dB may be applied to the audio input signal 105' at any one time. More specifically, for example, the gain may be filtered (e.g., via a low-pass filter) so as to not apply a gain at one time greater than the maximum gain. Further, the gain may be applied to the audio input signal so as to not amplify the audio input signal more than a maximum amplification level, as defined by maximum amplification parameter 162.

At block 420, the audio output signal may be processed, and method 400 may proceed to block 422. For example, a processor (e.g., second processor unit 110 of FIG. 1) may filter (e.g. equalizer (EQ) filtering), and/or cancel unwanted acoustics (e.g., acoustic echo cancellation) in audio output signal 107 to generate audio output signal 107'. Further, in some embodiments, the audio output signal may be converted from a digital signal to an analog signal.

At block 422, the audio output signal may be conveyed to an output device, such as a speaker. For example, the audio output signal may be conveyed to output device 208, as shown in FIG. 3.

One skilled in the art will appreciate that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments. For example, method 400 may further include receiving (e.g., at an AGC unit, such as AGC unit 108 of FIG. 1) an updated volume setting indicator signal. Method 400 may further include modifying at least one operational parameter (e.g., of the AGC unit 108; see FIG. 1) based on the updated volume setting indicator signal.

Figure 6:
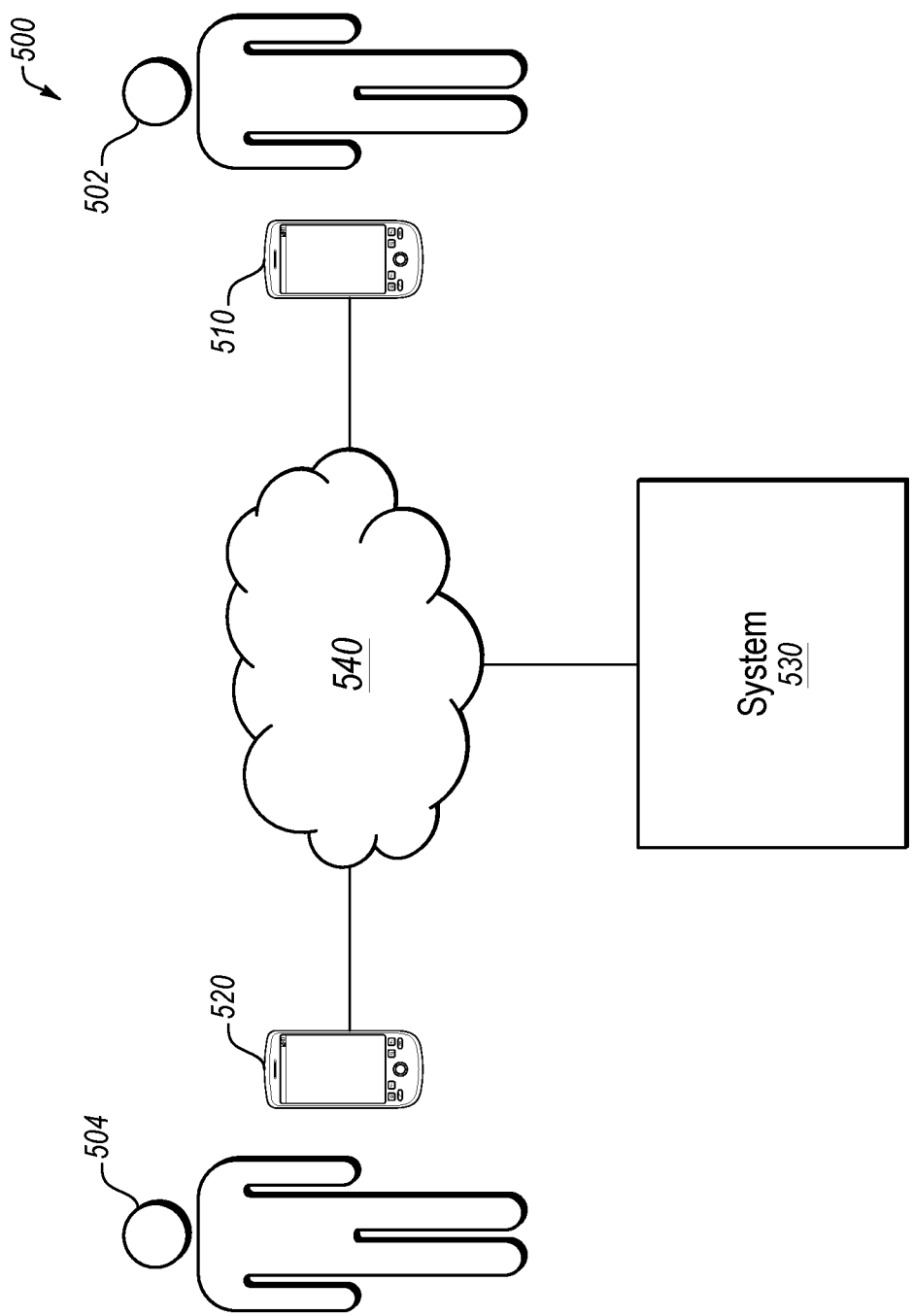
FIG. 6 illustrates an example communication system for facilitating a communication session.

FIG. 6 illustrates an example communication system 500 that may be arranged in accordance with at least one embodiment described in the present disclosure. Communication system 500, which may be configured for facilitating a communication session, may include a first device 510, a second device 520, and a system 530. First device 510 and system 530 may be communicatively coupled by a network 540. Alternately or additionally, first device 510 and second device 520 may be communicatively coupled by network 540. In some embodiments, network 540 may be any network or configuration of networks configured to send and receive communications between systems and devices. In some embodiments, network 540 may include a conventional type network, a wired or wireless network, and may have numerous different configurations. In some embodiments, network 540 may also be coupled to or may include portions of a telecommunications network, including telephone lines, for sending data in a variety of different communication protocols, such as a plain old telephone system (POTS).

In some embodiments, communication system 500 may be configured to facilitate an assisted call between a hearing-impaired user 502 and a second user 504. As used in the present disclosure, a "hearing-impaired user" may refer to a person with diminished hearing capabilities. Hearing-impaired users often have some level of hearing ability that has usually diminished over a period of time such that the hearing-impaired user can communicate by speaking, but that the hearing-impaired user often struggles in hearing and/or understanding others.

Alternatively or additionally, communication system 500 may be configured to facilitate a call between a person with medical expertise and/or experience and second user 504. As used in the present disclosure, a "person with medical expertise and/or experience" may be a nurse, doctor, or some other trained medical professional.

In some embodiments, a communication session, such as an audio or a video communication session, may be established between first device 510 and second device 520. In one example embodiment, the communication session may be a captioning communication session.

In some embodiments, system 530 may be an assistive service, which may be intended to permit a hearing-impaired person to utilize a communication network and assist their understanding of a conversation by providing text captions to supplement voice conversation occurring during communication sessions with other devices, such as second device 520. Alternatively or additionally, system 530 may be an assistive service to couple a person with medical expertise and/or experience with a person requesting medical assistance.

During a communication session, system 530 and first device 510 may be communicatively coupled using networking protocols. In some embodiments, during the communication session between first device 510 and second device 520, first device 510 may provide the audio signal from second device 520 to the system 530.

In some embodiments, at system 530, a call assistant may listen to the audio signal of second user 504 and "revoice" the words of second user 504 to a speech recognition computer program tuned to the voice of the call assistant. In these and other embodiments, the call assistant may be an operator who serves as a human intermediary between hearing-impaired user 502 and second user 504. In some embodiments, text captions may be generated by the speech recognition computer as a transcription of the audio signal of second user 504. The text captions may be provided to first device 510 being used by hearing-impaired user 502 over network 540. First device 510 may display the text captions while hearing-impaired user 502 carries on a normal conversation with second user 504. The text captions may allow hearing-impaired user 502 to supplement the voice signal received from second device 520 and confirm his or her understanding of the words spoken by second user 504.

Modifications, additions, or omissions may be made to communication system 500 without departing from the scope of the present disclosure. For example, in some embodiments, second user 504 may be hearing impaired. In these and other embodiments, system 530 may provide text captions to second device 520 based on audio data transmitted by the first device 510. Alternately or additionally, system 530 may include additional functionality. For example, system 530 may edit the text captions or make other alterations to the text captions after presentation of the text captions on the device 510.

In some embodiments, transceiver 100, device 200, and/or system 300 of FIGS. 1, 3, and 4, respectively, may be combined with communication system 500. For example, one communication system 500 may provide for volume-dependent automatic gain control. For example, one or more devices and/systems (first device 510, second device 520, and/or system 530) of communication system 500 may be configured for volume-dependent gain control. Yet more specifically, first device 510, second device 520, and/or system 530 may include at least one AGC unit (e.g., AGC unit 108 of FIG. 1) for performing the operations described with respect to FIG. 5.

As indicated above, the embodiments described herein may include the use of a special purpose or general purpose computer (e.g., processor 310 of FIG. 4) including various computer hardware or software modules, as discussed in greater detail below. Further, as indicated above, embodiments described herein may be implemented using computer-readable media (e.g., memory 312 or data storage 314 of FIG. 4) for carrying or having computer-executable instructions or data structures stored thereon.

In some embodiments, the different components, modules, engines, and services described herein may be implemented as objects or processes that execute on a computing system (e.g., as separate threads). While some of the systems and methods described herein are generally described as being implemented in software (stored on and/or executed by general purpose hardware), specific hardware implementations or a combination of software and specific hardware implementations are also possible and contemplated.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A device, comprising:
   an audio transceiver including:

an automatic gain control (AGC) unit configured to:
    receive an audio input signal;
    receive a volume setting indicator signal that corresponds to a user-defined volume setting that is configured to be dynamically adjusted by a user;
    set one or more operational parameters, including a maximum gain parameter that is determined based on the volume setting indicator signal, the maximum gain parameter defining a maximum amount of gain to be applied to the audio input signal during a particular period of time; and
    apply a gain a plurality of times to the audio input signal to generate an audio output signal, the gain being equal to the maximum gain parameter and each application of the gain being separated by at least the particular period of time.

2. The device of claim 1, wherein the one or more operational parameters further includes a maximum amplification parameter defining a total maximum amplification to be applied to the audio input signal.

3. The device of claim 1, wherein the AGC unit is further configured to set one or more other operational parameters based on a source of the audio input signal.

4. The device of claim 3, wherein the one or more other operational parameters comprise at least one of: an aggressiveness of one or more filters of the AGC unit, a noise threshold value for the AGC unit, and a default gain for the AGC unit.

5. The device of claim 1, wherein the gain is applied the plurality of times such that a target gain is applied to the audio output signal, the target gain being greater than the maximum gain parameter and being determined based on the volume setting indicator signal that corresponds to the user-defined volume setting.

6. The device of claim 5, wherein the gain is applied the plurality of times to generate the audio output signal at a particular output level and the device further comprises a volume control unit configured to receive the audio output signal from the AGC unit and to adjust a volume of the audio output signal as determined by the volume setting indicator signal such that the particular output level of the audio output signal as received by the volume control unit is changed.

7. The device of claim 1, wherein the audio transceiver further comprises:
    a first processing unit coupled to an input of the AGC unit and configured to process the audio input signal; and
    a second processing unit coupled to an output of the AGC and configured to process the audio output signal.

8. A computer-implemented method to generate an output signal, the method comprising:
    receiving an audio input signal at an automatic gain control (AGC) unit;
    receiving a volume setting indicator signal that corresponds to a user-defined volume setting that is configured to be dynamically adjusted by a user;
    setting one or more operational parameters for the AGC unit based on the volume setting indicator signal, the setting one or more operational parameters comprising setting a maximum gain parameter based on the volume setting indicator signal, the maximum gain parameter defining a maximum amount of gain to be applied to the audio input signal during a particular period of time; and
    applying, by the AGC unit, a gain a plurality of times to the audio input signal to generate an audio output signal, the gain being equal to the maximum gain parameter and each application of the gain being separated by at least the particular period of time.

9. The computer-implemented method of claim 8, wherein setting one or more operational parameters further comprises setting a maximum amplification parameter defining a total maximum amplification to be applied to the audio input signal.

10. The computer-implemented method of claim 8, wherein the gain is applied the plurality of times to generate the audio output signal at a particular output level and the method further comprises further adjusting a volume of the audio output signal as indicated by the volume setting indicator signal to further change the particular output level of the audio output signal.

11. The computer-implemented method of claim 8, further comprising setting one or more other operational parameters based on a source of the audio input signal, wherein setting one or more other operational parameters comprises at least one of: setting an aggressiveness of one or more filters of the AGC unit, setting a noise threshold value for the AGC unit, and setting a default gain for the AGC unit.

12. The computer-implemented method of claim 8, wherein the gain is applied the plurality of times such that a target gain is applied to the audio output signal, the target gain being greater than the maximum gain parameter and being determined based on the volume setting indicator signal that corresponds to the user-defined volume setting.

13. The computer-implemented method of claim 8, further comprising:
    receiving, at the AGC unit, an updated volume setting indicator signal; and
    modifying at least one operational parameter of the one or more operational parameters based on the updated volume setting indicator signal.

14. At least one non-transitory computer readable media configured to store one or more instructions that when executed by at least one computing system performs the method of claim 8.

15. A system to generate an output signal, the system comprising:
    a processing system configured to:
        receive an audio input signal;
        receive a volume setting indicator signal that corresponds to a user-defined volume setting that is configured to be dynamically adjusted by a user;
        set one or more operational parameters, including a maximum gain parameter that is determined based on the volume setting indicator signal, the maximum gain parameter defining a maximum amount of gain to be applied to the audio input signal during a particular period of time; and
        apply a gain a plurality of times to the audio input signal to generate an audio output signal, the gain being equal to the maximum gain parameter and each application of the gain being separated by at least the particular period of time.

16. The system of claim 15, wherein the one or more operational parameters further comprises a maximum amplification parameter defining a total maximum amplification to be applied to the audio input signal.

17. The system of claim 15, wherein the processing system is further configured to set one or more other operational parameters based on a source of the audio input signal.

18. The system of claim 15, wherein the plurality of times is a first plurality of times and the processing system is further configured to:

in response to a change in the volume setting indicator signal, apply the gain a second plurality of times to the audio input signal to generate the audio output signal, the first plurality of times being a different number than the second plurality of times.

19. The system of claim 15, wherein the gain is applied the plurality of times such that a target gain is applied to the audio output signal, the target gain being greater than the maximum gain parameter and being determined based on the volume setting indicator signal that corresponds to the user-defined volume setting.

20. The system of claim 15, wherein the gain is applied the plurality of times to generate the audio output signal at a particular output level and the processing system is further configured to further adjust a volume of the audio output signal as indicated by the volume setting indicator signal to further change the particular output level of the audio output signal.

* * * * *